US007018771B2

(12) United States Patent
Toyoda et al.

(10) Patent No.: US 7,018,771 B2
(45) Date of Patent: Mar. 28, 2006

(54) MATERIAL TRANSFER METHOD AND MANUFACTURING METHOD FOR SUBSTRATE FOR PLASMA DISPLAY

(75) Inventors: Osamu Toyoda, Kawasaki (JP); Kazunori Inoue, Kawasaki (JP); Akira Tokai, Kawasaki (JP)

(73) Assignees: Fujitsu Limited, Kawasaki (JP); Advanced PDP Development Center Corporation, Tokyo (JP)

( * ) Notice: Subject to any disclaimer, the term of this patent is extended or adjusted under 35 U.S.C. 154(b) by 0 days.

(21) Appl. No.: 11/110,784

(22) Filed: Apr. 21, 2005

(65) Prior Publication Data

US 2006/0024608 A1 Feb. 2, 2006

(30) Foreign Application Priority Data

Jul. 29, 2004 (JP) ............................. 2004-221032

(51) Int. Cl.
*B41M 1/10* (2006.01)
*B32B 31/20* (2006.01)
*C03B 21/00* (2006.01)
*G03F 7/40* (2006.01)
*B44C 1/165* (2006.01)

(52) U.S. Cl. ...................... 430/198; 430/252; 430/328; 101/170; 264/296; 156/89.11; 156/232; 156/245; 156/307.1; 427/495

(58) Field of Classification Search ............. 156/89.11, 156/232, 245, 307.1; 264/296; 101/170; 427/495; 430/198, 252, 328
See application file for complete search history.

(56) References Cited

U.S. PATENT DOCUMENTS 3,531,317 A * 9/1970 Patheiger et al. ........... 427/493
5,853,446 A * 12/1998 Carre et al. .................. 65/17.3
5,992,320 A * 11/1999 Kosaka et al. ........... 101/401.1
6,601,629 B1 * 8/2003 Toyoda et al. .............. 156/540
6,632,116 B1 * 10/2003 Watanabe et al. ............. 445/24
6,761,607 B1 * 7/2004 Kikuchi et al. ............... 445/24

FOREIGN PATENT DOCUMENTS

JP 08-273537 10/1996
JP 10-101373 4/1998

* cited by examiner

*Primary Examiner*—Richard L. Schilling
(74) *Attorney, Agent, or Firm*—Staas & Halsey LLP

(57) ABSTRACT

The present invention provides a highly reliable technology for manufacturing a substrate with protrusions. After filling an UV-curable transfer material into the grooves of an intaglio plate for transfer, the UV-curable transfer material is cured by irradiating UV rays under the conditions where it is exposed to an atmosphere that contains at least one of oxygen and ozone while a curing-inhibited portion is formed in an area of the UV-curable transfer material exposed to this atmosphere, and the UV-curable transfer material is transferred to the substrate to form the protrusions, while the curing-inhibited portion is made to adhere to the substrate.

5 Claims, 13 Drawing Sheets

MATERIAL TRANSFER METHOD AND MANUFACTURING METHOD FOR SUBSTRATE FOR PLASMA DISPLAY

CROSS-REFERENCE TO RELATED APPLICATIONS

This application is based upon and claims the benefit of priority from the prior Japanese Patent Application No. 2004-221032, filed on Jul. 29, 2004, the entire contents of which are incorporated herein by reference.

BACKGROUND OF THE INVENTION

1. Field of the Invention

The present invention relates to a substrate requiring protrusions in the display area, such as in the case of a plasma display (PDP), and more specifically to a technology for manufacturing a substrate utilizing a transfer method using an intaglio plate for transfer.

2. Description of the Related Art

A PDP will be described as an example of a case where a substrate having protrusions according to the present invention is required. A PDP is a self light emitting display panel where a pair of substrates (normally glass substrates) are disposed facing each other with a small space in between, and a discharge space is created inside by sealing the periphery thereof.

Generally in a PDP, ribs (protrusions) with a 100 to 250 μm height to partition the discharge space, are formed on a substrate in a repeated manner. For example, in the case of a surface-discharge type PDP which is suitable for color display, ribs having a pattern which can be seen as stripes when the PDP is viewed directly, are formed on the substrate with equal spaces in between along the address electrode lines. By these ribs, discharge interference and cross-talk of colors are prevented.

As a general process to manufacture a PDP substrate having the above mentioned structure, the address electrode pattern is formed on the substrate, and the ribs are formed so as to align to the electrode pattern. Various methods have been proposed and used for forming the ribs, but typical methods are a multilayer printing method, sandblast method, additive method, photo-lithography method and transfer method, of which the transfer method, with which the lowest cost may be possible, has high expectations.

The transfer method is a method of forming the ribs or a method of simultaneously forming the ribs and a dielectric layer on a substrate, using an intaglio plate for transfer having grooves for forming ribs. As a procedure, a molding material is filled into the surface of the intaglio plate for transfer, then the solidified or cured molding material that has been filled is transferred to the substrate to form the ribs and the dielectric layer (e.g. Japanese Patent No. 3321129 (claims), Japanese Patent Application Laid-Open No. H8-273537 (claims), and Japanese Patent Application Laid-Open No. 2001-191345 (claims).

The transfer methods include an adhesion transfer method (see Japanese Patent Application Laid-Open No. H10-326560 (claims)) where a transfer material is solidified by removing the solvent of the transfer material filled in the grooves of an intaglio plate for transfer, and the transfer material is transferred to a substrate utilizing the adhesion of the transfer material, and an ultraviolet (UV)-curing transfer method (see Japanese Patent Application Laid-Open No. 2001-191345 (claims)), where an ultraviolet-curable transfer material is inserted between an intaglio plate for transfer and a substrate, the transfer material is extended by a roller or the like with the intaglio plate for transfer and the substrate pressing against each other, and is filled into the concave portions of the intaglio plate for transfer, then the transfer material is adhered to the substrate by irradiating UV rays.

In the adhesion transfer method, a transfer material paste is filled into the grooves of the intaglio plate for transfer, then the solvent is removed to solidify the transfer material, so a material of an intaglio plate for transfer with low hardness can be used, and when the intaglio plate for transfer is released (demolded), little damage occurs even if the shape of the ribs is complicated.

SUMMARY OF THE INVENTION

In the case of a transfer material paste comprised of an adhesive resin, solvent, low melting point glass material, etc., however, excessive drying not only evaporates the solvent, but also decomposes and evaporates, or deteriorates part of the adhesive resin, so management of the drying conditions to implement uniform adhesion which dominates transfer probability, is becoming difficult as the target substrate size increases. If adhesion is uneven, problems occur, for example, such as one that while some portions have sufficient adhesion to be transferred, other portions have insufficient adhesion, or are dried so much so that adhesion is lost.

In the case of the UV-curing transfer method, the transfer material which is caught between the intaglio plate for transfer and the substrate adheres to the substrate by curing, therefore adhesion stability to the substrate is good, but the intaglio plate for transfer must be hard to protect the shape of the protrusions from being disturbed, since the intaglio plate for transfer and the substrate must be pressed against each other when the transfer material is sandwiched between them, and accordingly, a complicated shape (e.g. sharp curves) cannot be applied to protrusions. In the case of the method of extending the transfer material by a roller or the like with the intaglio plate for transfer and the substrates pressing against each other, so that the transfer material is filled into the concave portions of the intaglio plate for transfer, it is difficult to limit the transfer area, and if the protrusions are linked with a plane portion such as a case of ribs linked with a dielectric layer in a PDP, it is difficult to set the film thickness of the dielectric layer between the ribs.

With the foregoing in view, it is an object of the present invention to solve the above problems of the adhesion transfer method and the UV-curing transfer method and provide a highly reliable technology for manufacturing substrates with protrusions. The other objects and advantages of the present invention will be clarified by the following description.

According to one aspect of the present invention, a manufacturing method for a substrate with protrusions, comprising: filling a UV-curable transfer material into grooves of an intaglio plate for transfer; then irradiating UV rays under conditions where the UV-curable transfer material is exposed to an atmosphere that contains at least one of oxygen and ozone, to cure the UV-curable transfer material and form a curing-inhibited portion in the area of the UV-curable transfer material exposed to this atmosphere; and transferring the UV-curable transfer material to the substrate to form the protrusions with the curing-inhibited portion adhered to the substrate, is provided.

Preferable are that the manufacturing method further comprises: irradiating UV rays through the substrate or the intaglio plate for transfer after the adhesion; that at least one of the substrate and the intaglio plate for transfer transmits UV rays; that the atmosphere containing at least one of oxygen and ozone is an air atmosphere, or is a mixed atmosphere of air and oxygen, or a mixed atmosphere of air and ozone, or a mixed atmosphere of air, oxygen and ozone, and then the atmosphere that contains at least one of oxygen and ozone is created by supplying a gas flow that contains at least one of oxygen and ozone to the surface of the intaglio plate for transfer; that the UV-curable transfer material contains a low melting point glass material, a photopolymerizable compound and a photopolymerization reaction initiator; that the photopolymerization reaction initiator is a radical polymerization initiator; that the UV-curable transfer material further contains an adhesive substance; that the protrusions have a stripe pattern, a repeating meander pattern, or a lattice pattern; that the protrusions are linked with a plane portion; that the height of the protrusions is in a 100 to 250 μm range, and the width of the protrusions is in a 35 to 90 μm range; that the thickness of the plane portion is in a 10 to 30 μm range, and that the intaglio plate for transfer transmits UV rays and is enclosed by a metal frame.

According to the above aspect of the present invention, the above mentioned shortcomings of the prior art can be overcome, and a highly reliable technology for manufacturing a substrate with protrusions can be implemented.

According to other aspects of the present invention, a substrate manufactured by the above substrate manufacturing method, a gas discharge panel using this substrate as a substrate with ribs, and a gas discharge panel display device using this substrate as a substrate with ribs are provided.

By these aspects of the present invention, a gas discharge panel and a gas discharge panel display device with superb display qualities can be implemented.

According to the present invention, a highly reliable technology for manufacturing a substrate with protrusions can be provided.

DESCRIPTION OF THE PREFERRED EMBODIMENTS

Figure 1:
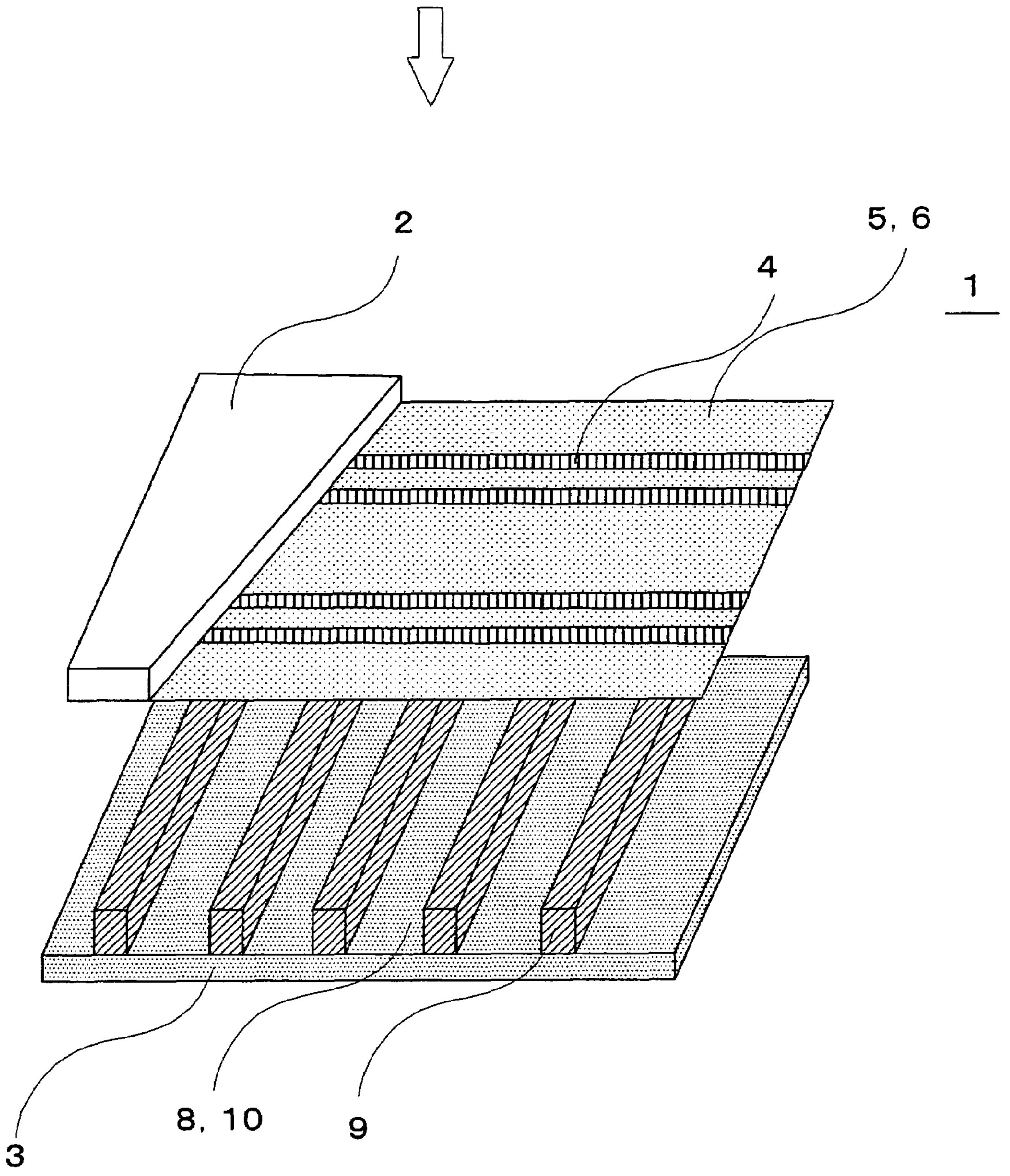
FIG. 1 is a schematic exploded view depicting an example of a PDP.

Embodiments of the present invention will now be described using drawings, examples, etc. These drawings, examples, etc. and description are for illustrating the present example, and shall not limit the scope of the present invention. Needless to say, other embodiments are within the scope of the present invention as long as they match the essential character of the present invention. In the drawings, the same elements are denoted with the same reference numerals or signs.

Figure 2:
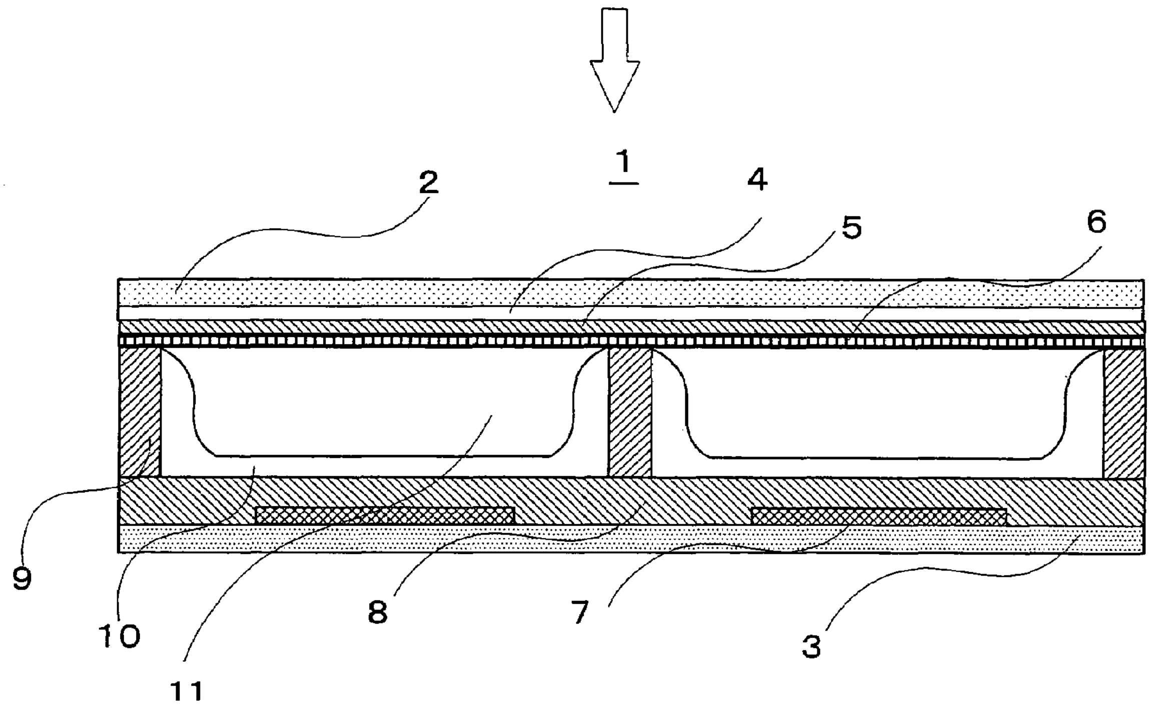
FIG. 2 is a schematic side cross-sectional view depicting an example of a PDP.

FIG. 1 is an exploded view of an example of a conventional PDP, and FIG. 2 is a side cross-sectional view thereof. In FIG. 1 and FIG. 2, the panel is seen from the direction along the arrow marks shown. The PDP 1 has a structure where the front substrate 2 and the back substrate 3 face each other. In this example, inside the front substrate 2 (side facing the back substrate 3), display electrodes 4, a dielectric layer 5 and a protective layer 6 for protecting the dielectric layer are sequentially layered, and inside the back substrate 3 (side facing the front substrate 2), address electrodes 7 and a dielectric layer 8 are sequentially layered, and ribs 9 and a phosphor layer 10 are formed thereon. The dielectric layer 8 may be unnecessary in the case of a system in which a sustain discharge for display is caused by applying voltage between two display electrodes in the three electrode, surface discharge structure as shown in FIG. 1.

In the discharge space 11 enclosed by the dielectric layer 5, ribs 9 and phosphor layer 10, a gas for UV emission, such as a neon gas or xenon gas, is sealed in. The PDP 1 causes discharge by applying voltage between two display electrodes, exciting the gas for UV emission and illuminating the phosphor of the phosphor layer 10 using the UV rays which are generated when the excited state returns to the original state, so that display of visible light is implemented. In the PDP, a color filter, electromagnetic wave shielding sheet, anti-reflection film, etc. are often installed. By installing an interface with a power supply unit and tuner unit to this PDP, a gas discharge panel display device such as a large TV (plasma TV) set can be implemented.

For the substrate of the PDP, soda-lime glass and high-strain-point glass are used, for example. For the address electrodes, any metal having conductivity can be used. Copper, silver, or the like is usually used as a major material. For the dielectric layer, a low-melting-point glass or the like is used. The ribs 9 are made of a low-melting-point glass.

Figure 3:
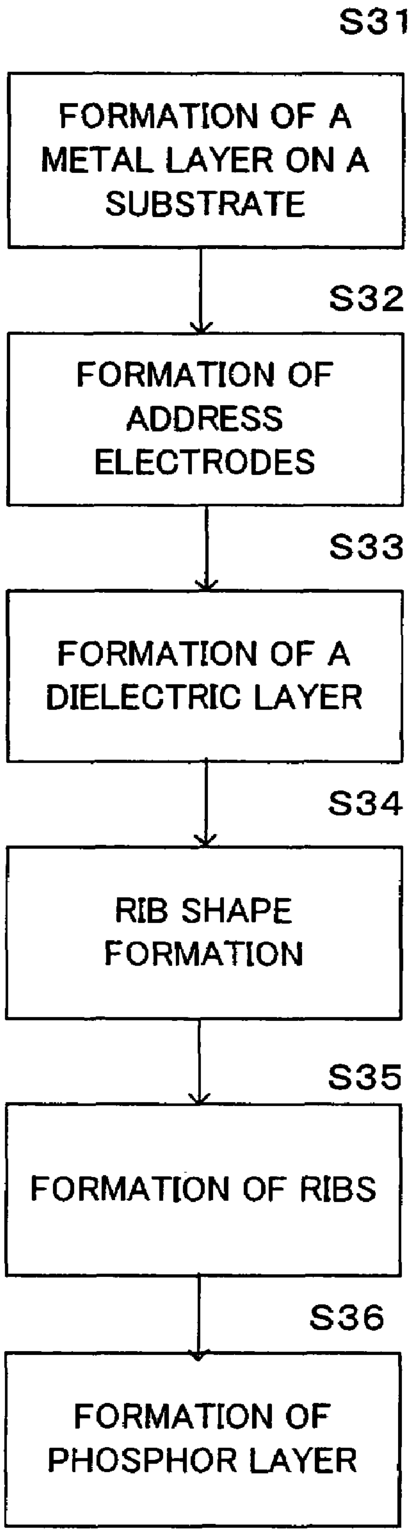
FIG. 3 is a flow chart depicting the sequence of forming ribs on a substrate for a PDP.

Inside the back substrate 3, the address electrodes 7, dielectric layer 8, ribs 9 and phosphor layer 10 are formed according to the following sequence, for example. First with reference to FIG. 3, a uniform metal layer is formed on the back substrate 3, as shown in step S31. Then as step S32 shows, unnecessary portions are removed and the address electrodes 7 having a predetermined pattern are formed. Then as step S33 shows, the dielectric layer 8 is formed. Then as step S34 shows, the shape of the ribs is formed by transferring a transfer material paste containing a low melting point glass from the intaglio plate for transfer, and as step S35 shows, this transfer material is fired to become ribs, then as step S36 shows, the phosphor is coated. Step S33 can be omitted, or it is also possible that step S33 is omitted, and the ribs and the plane portion are formed together in step S34, so as to obtain the dielectric layer and ribs simultaneously in step S35.

The present invention can also be applied suitably to forming ribs as protrusions, on the substrate used for gas discharge panels and gas discharge panel display devices, represented by PDP's. However, the present invention can be favorably applied, without being limited to these fields, to other fields where protrusions are formed on a substrate. The three-dimensional shape of a protrusion may be any shape, as long as it is not counter to the essential character of the present invention. It may have angles somewhat tapered (draft angle) to make transfer to the substrate easier. In the case of a rectangular parallelepiped shape as shown in FIG. 1, for example, the cross-section can be made to be a trapezoid.

In the present invention, a "substrate" is not limited to substrates for electronic equipment such as a PDP, but can be any substrate. The material for the substrate may be any material, unless it is counter to the essential character of the present invention.

Figure 4:
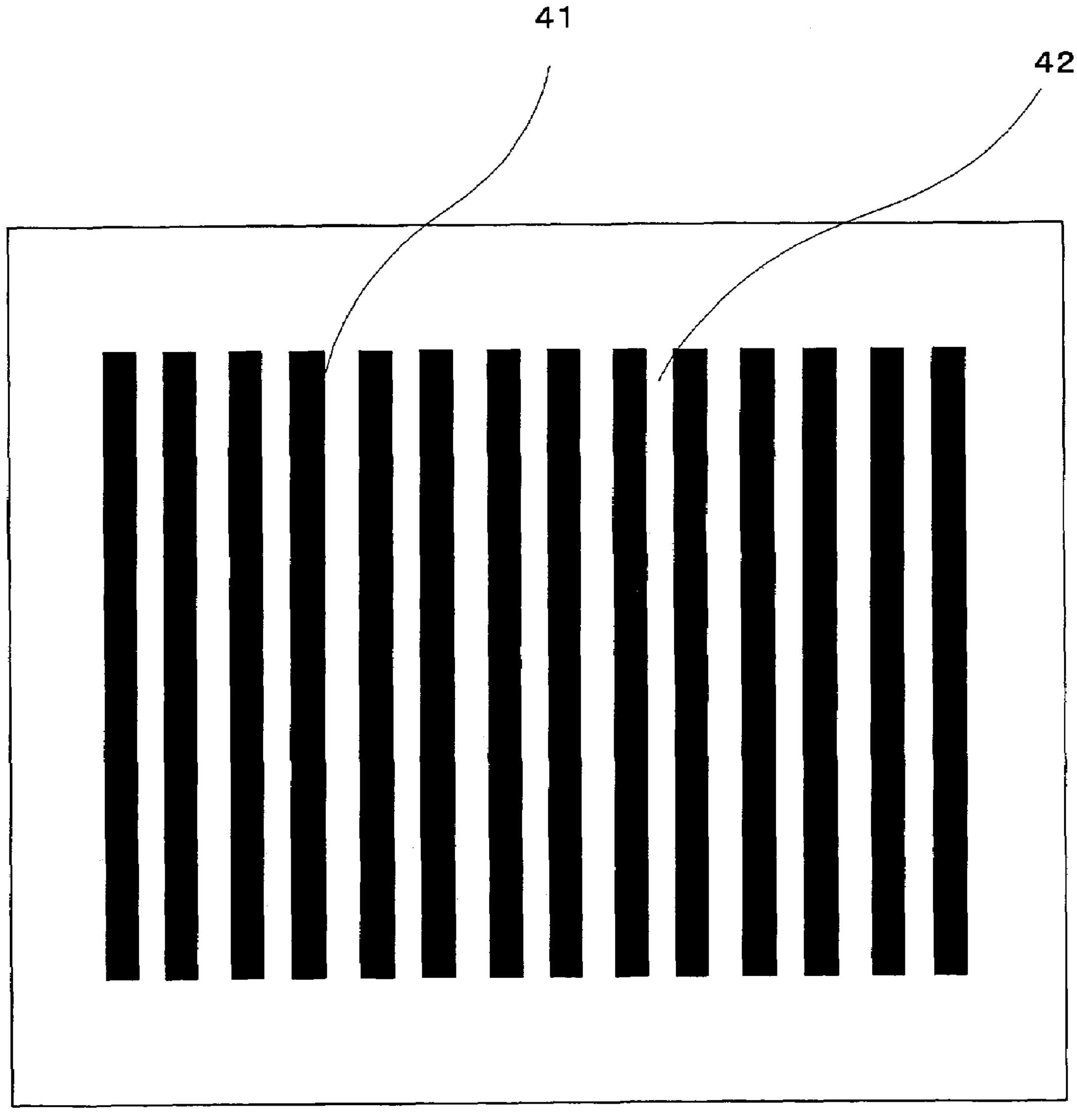
FIG. 4 is a schematic view depicting a striped pattern of protrusions.
Figure 5:
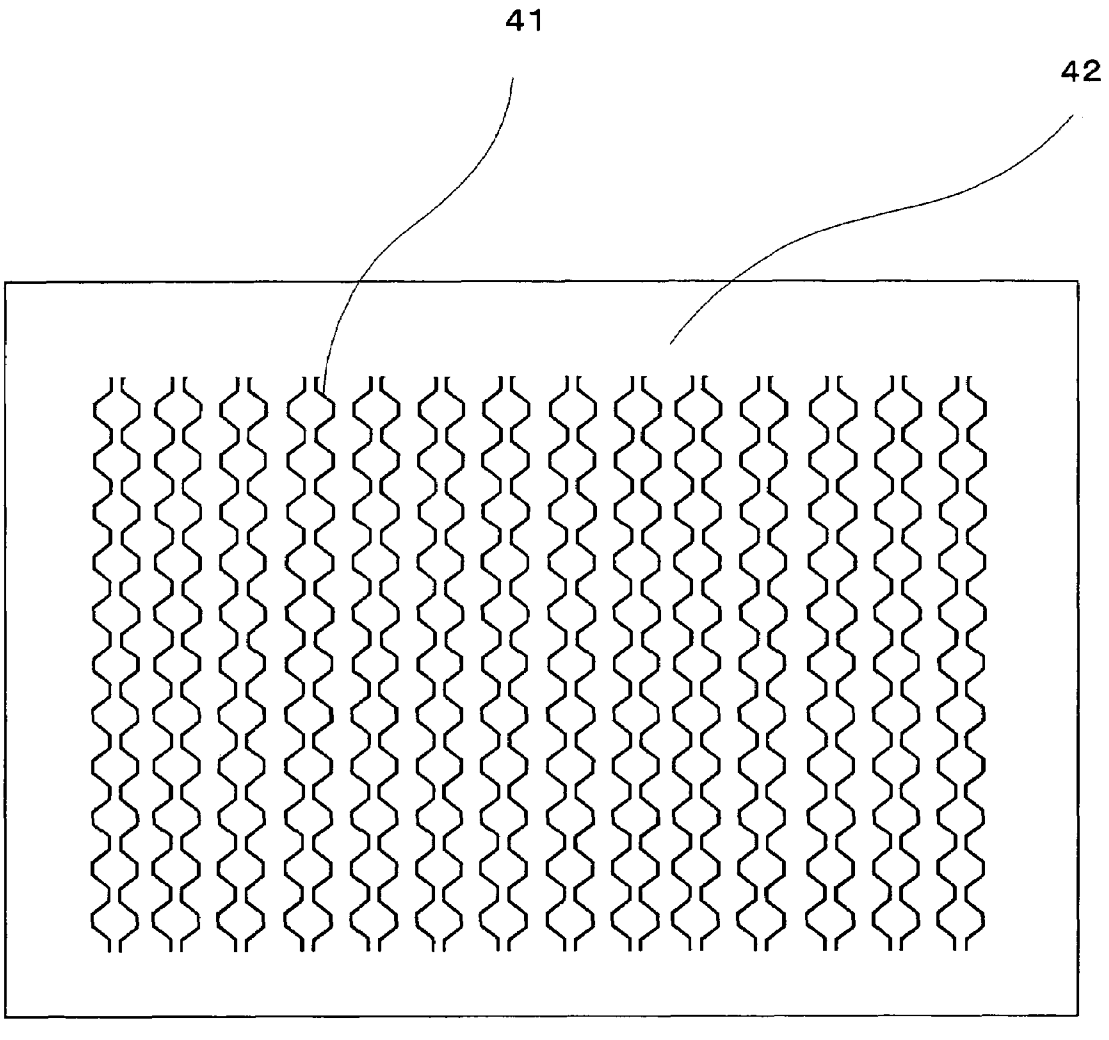
FIG. 5 is a schematic view depicting a meander pattern of protrusions.
Figure 6:
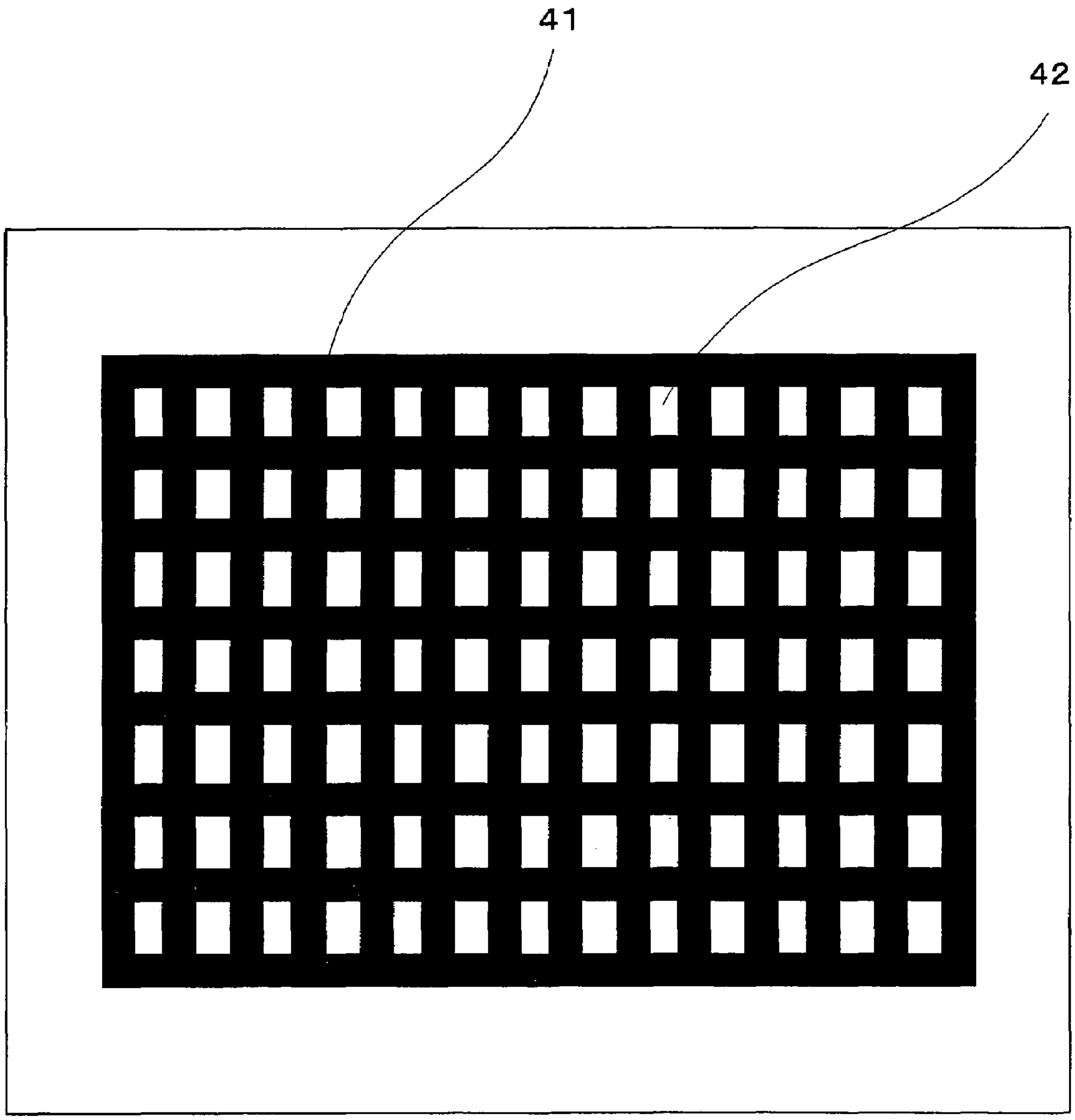
FIG. 6 is a schematic view depicting a lattice pattern of protrusions.

In the present invention, the protrusion formation pattern may be any pattern. Examples are a repeating stripe pattern as shown in FIG. 4, repeating meander pattern as shown in FIG. 5, and repeating lattice pattern as shown in FIG. 6. In FIG. 4 to FIG. 6, the reference numeral 41 indicates a protrusion pattern, and the reference numeral 42 is a base portion other than the protrusions (target face).

Now the transfer method for transferring a UV-curable transfer material and the manufacturing method for a substrate with protrusions according to the present invention will be described. In the present invention, "curing" refers to curing by a cross-linking reaction, but the case where "solidification" is simultaneously caused by solvent removal also belongs to the category of "curing" according to the present invention.

According to the manufacturing method for the substrate of the present invention, the UV-curable transfer material is filled into the grooves of an intaglio plate for transfer, then UV rays are irradiated under the conditions where the UV-curable transfer material is exposed in an atmosphere that contains at least one of oxygen and ozone, so as to cure the UV-curable transfer material and also to form a curing-inhibited portion in the area of the UV-curable transfer material exposed to the atmosphere, then the UV-curable transfer material is transferred to the substrate, with the curing-inhibited portion being adhered to the substrate, and the protrusions are formed.

When the UV-curable transfer material is filled into the grooves of the intaglio plate for transfer, the surface of the filled material is exposed to the outside. Therefore, when the environment where the intaglio plate for transfer is set is an atmosphere that contains at least one of oxygen and ozone, the surface of the filled material is exposed to the atmosphere that contains at least one of oxygen and ozone, and after UV rays are irradiated, the curing-inhibited portion is formed on and around the surface of the filled material. Hereafter the UV-curable transfer material is simply referred to as "transfer material".

The transfer material according to the present invention can be selected freely from known materials that cure by UV rays, according to the actual requirements for the protrusions to be formed on the substrate. For the purpose of forming ribs on the substrate for a PDP, it is preferable that the raw transfer material contains a low melting point glass powder, binder, etc. A heat resistant oxide or the like may be added as a filler. The viscosity of the raw transfer material is preferably 50 to 100 P (poise) at room temperature in terms of ease of handling. The binder includes an organic resin that cures by UV rays. Examples of organic resins that cure by UV rays are an acrylic resin and vinyl resin. In terms of combustibility, an acrylic resin is better, and for the vinyl resin, a UV-curable resin where a diazonium salt is added to polyvinyl alcohol, for example, can be used. Accordingly, a photopolymerizable compound that is cross-linkable and curable by UV rays is preferable. The photopolymerizable compound can be a monomer, or oligomer, or prepolymer. At this time, a photopolymerization reaction initiator may be used together. In the case where the organic resin is cured by a photo-radical reaction, examples of a photopolymerization reaction initiator are a sensitizer, radical polymerization initiator and photo-radical polymerization initiator.

If the molding material is cured after it is filled into the grooves of the intaglio plate for transfer, releasing (so called demolding) of the transfer material from the grooves of the intaglio plate for transfer is easier at transfer onto the substrate, and the integration of the shape improves, so such problems as the transfer material becoming damaged and partially remaining in the grooves of the intaglio plate for transfer can be prevented. Curing may initially be incomplete, insufficient or undercured, and made to complete after the transfer material is transferred onto the substrate.

Binders may include solvent. Examples of solvent are terpineol and BCA (butyl carbitol acetate). The solvent can adjust the viscosity of the raw transfer material.

For the material of the intaglio plate for transfer, it is preferable to use a soft material that can be easily released, so as not to damage the shape of the molded material at transfer. An example is a silicone rubber.

The reason of irradiating UV rays under the conditions where the transfer material is exposed in an atmosphere that contains at least one of oxygen and ozone is that the curing reaction on the surface area of the transfer material that is exposed in this atmosphere is inhibited by the oxygen or ozone and the curing-inhibited portion is formed on the exposed surface area. The fact that the curing reaction being inhibited can be easily judged by the curing-inhibited portion maintaining adhesiveness even if the transfer material in general is cured and able to be transferred from the intaglio plate for transfer. Actually it may be possible to consider that the curing-inhibited portion has been formed, when UV ray irradiation has been performed onto the transfer material under the conditions where the transfer material is exposed in an atmosphere that contains at least one of oxygen and ozone. The time of UV irradiation can be selected freely according to actual manufacturing conditions. An example is about 10 seconds to about 3 minutes. The wavelength range of the UV rays to be used can also be selected freely according to actual manufacturing conditions. An example is a 300 to 400 nm range.

The content of oxygen or ozone in the atmosphere that contains at least one of oxygen and ozone can be easily determined by trial and error according to actual transfer conditions. The base gas to create an atmosphere that contains at least one of oxygen and ozone may be a gas that does not inhibit the curing of the transfer material such as nitrogen or argon, but may simply be air. The atmosphere that contains at least one of oxygen and ozone may be a mixture of a gas that does not inhibit the curing of the transfer material such as nitrogen or argon, and oxygen, ozone or air, but may also be a mixed atmosphere of air and oxygen, or a mixed atmosphere of air and ozone, or a mixed atmosphere of air, oxygen and ozone. An air atmosphere itself may also be used. An air atmosphere, or a mixed atmosphere of air and oxygen, or a mixed atmosphere of air and oxygen or a mixed atmosphere of air, oxygen and ozone is preferable since it does not complicate the manufacturing environment.

The degree of inhibiting the curing of the curing-inhibited portion can be determined by selecting an atmosphere that contains at least one of oxygen and ozone and selecting a transfer material that can exhibit an appropriate curing inhibition. These selections can be performed easily by experiment.

An atmosphere that contains at least one of oxygen and ozone can be easily created by supplying a gas that contains at least one of at lest oxygen and ozone to the intaglio plate for transfer.

The transfer material may be placed in an atmosphere that contains at least one of oxygen and ozone before UV irradiation, if only after the transfer material is filled into the intaglio plate for transfer, but generally placement at the same time with irradiation of UV rays is sufficient.

When the above are fulfilled, as the curing-inhibited portion adheres to the substrate and the transfer material is transferred to the substrate to form the protrusions, the curing-inhibited portion indicates adhesiveness, which makes the adhesion of the transfer material to the substrate even stronger, and provides superbly consistent adhesion to the substrate. In order to further increase the adhesion of the curing-inhibited portion, the transfer material may contain an adhesive substance. For this adhesive substance, an adhesive resin with a low glass-transition temperature (about −150 to 60° C.) may be preferably used.

According to the present invention, even if the curing progress state is different depending on the location, the range where the curing-inhibited portion can maintain adhesion can be easily determined for both locations where curing is slow and where curing is fast, which makes it easier to manufacture large substrates.

Furthermore, since the transfer material in general is cured, there is less possibility for the transfer material to be deformed even if pressure is applied at adhesion. Therefore even if the protrusions have a complicated shape, transfer is possible without deforming the shape. And even if the degree of curing of the transfer material is small and deformation may occur when high pressure is applied, the pressure given between the intaglio plate for transfer and the substrate so as to adhere the curing-inhibited portion to the substrate, can be minimized, since the curing-inhibited portion has adhesiveness, which also makes it easier to maintain the shape. The degree of pressure to be applied can be determined according to the actual manufacturing situation.

In terms of phenomena, the inhibition of curing refers to a state where the inhibited portion of a curing target is uncured and indicates adhesiveness, while the non-inhibited portions are cured to a certain degree by cross-linking or the like, and in terms of chemical reaction, this phenomena is regarded that oxygen reacts with and consumes generated radicals, so that the polymerization activity or curing activity is lost, in a photopolymerization reaction by UV irradiation. For example, if the density of generated photopolymerization reactive radicals is decreased in the surface layer of the transfer material, that is, on and near the surface of the above mentioned filled material to decrease the polymerization speed, an unreacted photopolymerizable compound remains in the inhibited portion of the curing target even at a stage where non-inhibited portions become cured to a certain degree, and therefore the inhibited portion exhibits adhesion as is uncured.

The layer where curing is inhibited is only the surface layer, and all the other potions of the transfer material in the grooves of the intaglio plate for transfer can be cured. The surface of the transfer material can make an adhesion layer, which has extremely high reproducibility. Also, the curing-inhibited portion does not cause any problems afterwards, since the resin components are burnt in the firing step after adhesion and transfer.

Also even in the curing-inhibited portion, if an appropriate amount of radicals are generated later, for example, re-curing is possible in the photo-radical polymerization, so if UV rays are irradiated through the substrate or the intaglio plate for transfer onto the transfer material, the curing-inhibited portion cures, since the transfer material does not contact oxygen or ozone once the curing-inhibited portion has adhered to the substrate, and the film strength increases, therefore transfer reliability and yield can be further favorably improved.

If the UV rays are irradiated through the substrate or the intaglio plate for transfer onto the transfer material in the intaglio plate for transfer, the UV rays are irradiated further onto the portions at the opposite side of the curing-inhibited portion. Therefore even in the case of a portion which has relatively sharp angles, such as the case of a rectangular parallelepiped shape, sufficient curing is implemented, and an improvement of the shape traceability and a decrease of residue in the intaglio plate for transfer can be attained.

Since the transfer material in the curing-inhibited portion cures in this way, the reliability of transfer and yield can be further improved. In order for the UV rays to reach the curing-inhibited portion through the substrate or the intaglio plate for transfer, the substrate and intaglio plate for transfer must transmit UV rays. Specifically, UV transmittance is preferably 60% or more. For this, a glass substrate can be used for the substrate, or a transparent silicone rubber can be used for the intaglio plate for transfer.

When these UV rays are irradiated, it is now unnecessary to inhibit curing. Therefore if the first UV irradiation is executed in an atmosphere that contains oxygen and ozone, UV irradiation through the substrate or the intaglio plate for transfer, that is a subsequent UV irradiation, may be preferably executed in an atmosphere that does not contain oxygen and ozone. In some cases this can be easily implemented, for example, by using air mixed with ozone prepared by an ozonizer for the first UV irradiation, then stopping the operation of the ozonizer for the subsequent UV irradiation. It is to be noted that the transfer material area that has been exposed in the atmosphere is no longer present in the case of the subsequent UV irradiation. Accordingly, it is also possible to irradiate UV rays in an atmosphere that contains oxygen and ozone. If the first UV irradiation is executed in a simple air atmosphere, for example, the subsequent UV irradiation may also be executed in the same air atmosphere. When the air mixed with ozone by an ozonizer is used for the first UV irradiation and the operation of the ozonizer is stopped for the subsequent UV irradiation, it is unnecessary, in many cases, to wait until the ozone in the atmosphere is absent.

Protrusions may be of any shape and structure. In the case of a PDP, a stripe-type, meander-type and lattice-type can be used as examples. The height of the stripes and the lattice can be a uniform height, but a plurality of different heights may be included. For example, the height may be different between the lines of the lattice perpendicular to each other. These shapes are determined by the shape of the grooves of the intaglio plate for transfer.

Figure 7:
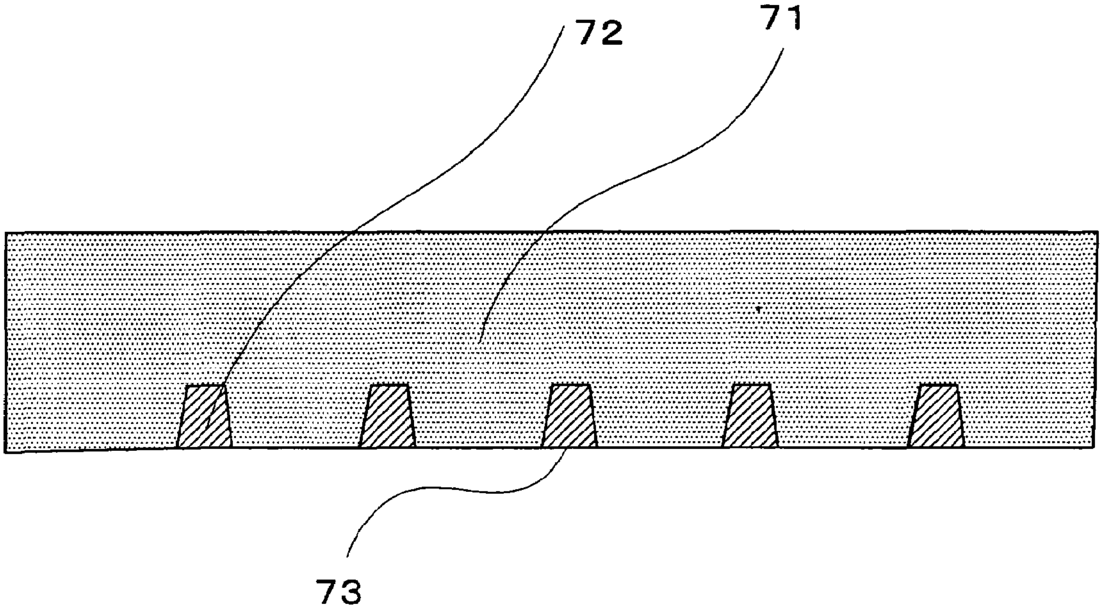
FIG. 7 is a schematic side cross-sectional view depicting a state where a transfer material is filled only in the grooves of an intaglio plate for transfer.
Figure 8:
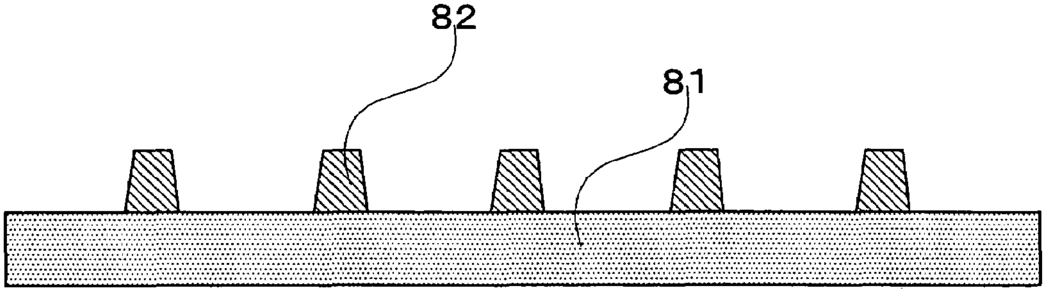
FIG. 8 is a schematic side cross-sectional view depicting a state where only the shape of protrusions is transferred onto a substrate.
Figure 9:
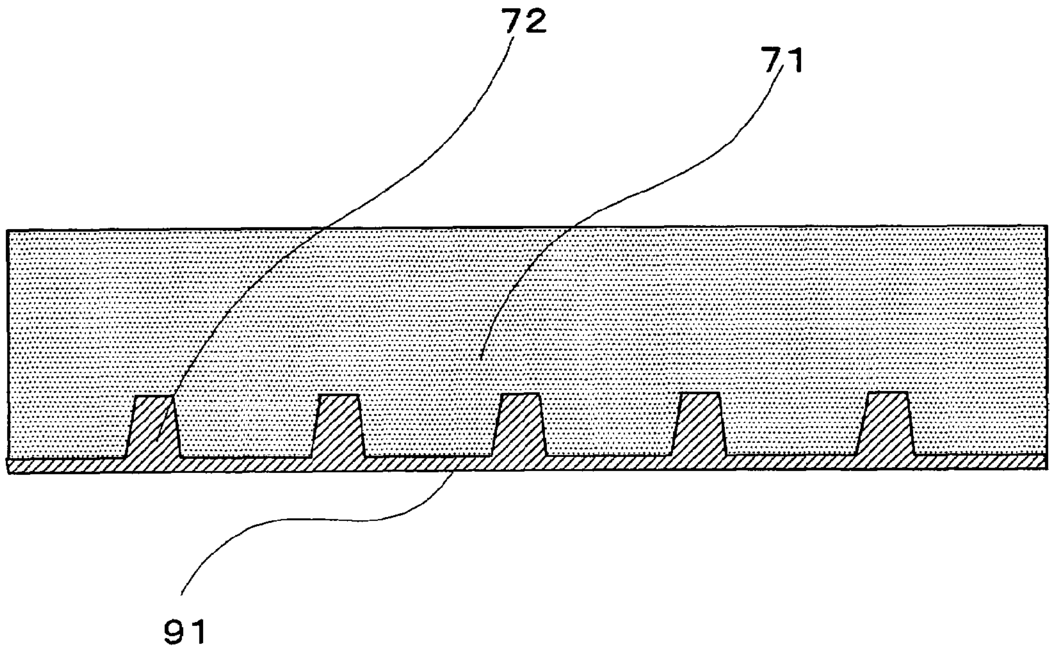
FIG. 9 is a schematic side cross-sectional view depicting a state where a transfer material is coated not only on the grooves of an intaglio plate for transfer but also on the surface of the intaglio plate for transfer other than the grooves.
Figure 10:
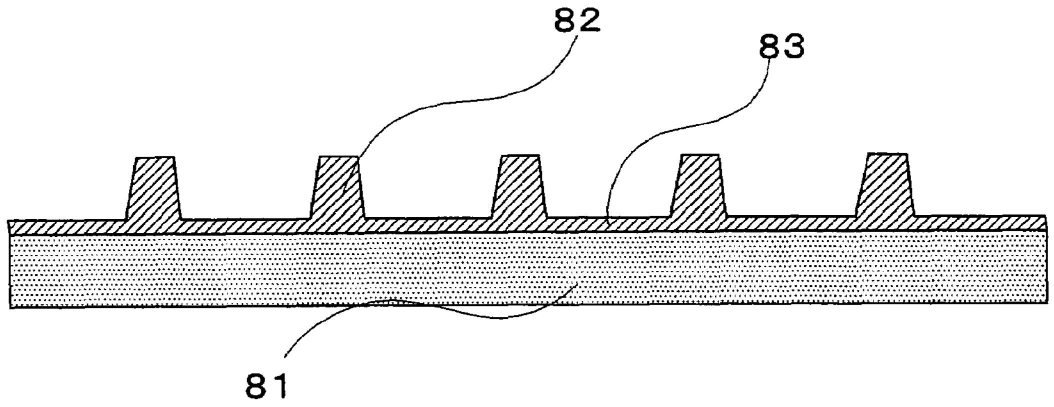
FIG. 10 is a schematic side cross-sectional view depicting a state where the shape of protrusions linked with a plane portion is transferred onto a substrate.

When the transfer material is filled into the intaglio plate for transfer, the shape of only protrusions 82 are formed on the substrate 81, as shown in FIG. 8, if the transfer material 72 is filled only into the grooves of the intaglio plate for transfer 71, as shown in FIG. 7, but if the transfer material 72 is also coated on the surface of the intaglio plate for transfer in addition to the grooves, as shown in FIG. 9, then the protrusions 82 linked with the plane portion 83, as shown in FIG. 10, can be formed on the substrate 81. This means that the ribs and the dielectric layer are formed simultaneously in a PDP. The reference numeral 73 in FIG. 7 and the reference numeral 91 in FIG. 9 are the surface of the filled material according to the present invention.

The transfer material can be easily coated on the surface of the intaglio plate for transfer in addition to the grooves by forming a predetermined thickness of film by a roll coating method after filling the transfer material into the intaglio plate for transfer, for example. By this, the adjustment of the thickness of the plane portion is easier. “Filling” according to the present invention includes such coating.

The present invention exhibits higher reliability when the shape of the protrusions is larger in height than in width. It is preferable that the height of the protrusion is in a 100 to 250 μm range, and the width of the protrusion is in a 35 to 90 μm range. The interval of the protrusions is not very critical, but preferably is in a 50 to 330 μm range. The thickness of the plane portion is preferably in a 10 to 30 μm range. These dimensions are those measured when the protrusions and the plane portion are formed on the substrate.

In this way, substrates on which various protrusions are formed can be manufactured by a highly reliable method. According to this method, damage decreases when the intaglio plate for transfer is released, even if the protrusions have complicated shapes, and uniform adhesion, which predominantly influences transfer probability, can be easily implemented even if the target substrate is large. Since the pressure to press the intaglio plate for transfer and the substrate at adhesion can be small, and the major portions of the transfer material can be sufficiently cured, the shape of the protrusions can be more easily maintained. Accordingly, complicated shapes can be easily handled. The transfer area can also be easily limited. Since transfer can be performed after sufficient curing, residue in the intaglio plate for transfer is expected to be less.

Also it is easy to provide sufficient hardness to the cured portions, so dimensional changes at adhesion and transfer are small, and accordingly, even in a case where protrusions are linked with the plane portion, such as the case of the ribs of the PDP linked with the dielectric layer, the film thickness can be easily set.

Substrates manufactured by the present invention, where damage on protrusions occurs less and contamination in the grooves of the intaglio plate for transfer is less, are superb in the reproducibility of the shape of the protrusions, even after long term use, and for the gas discharge panels and gas discharge panel display devices using these substrates as substrates with ribs, superb display quality can be expected.

In the above description, UV rays are used as the rays used for curing, but the present invention can also be applied to cases where other active energy rays are used instead of UV rays. In such cases, “UV-curable transfer material” may be replaced by “active energy ray-curable transfer material”, for example.

EXAMPLES

Examples of the present invention will now be described.

Example 1

Figure 11:
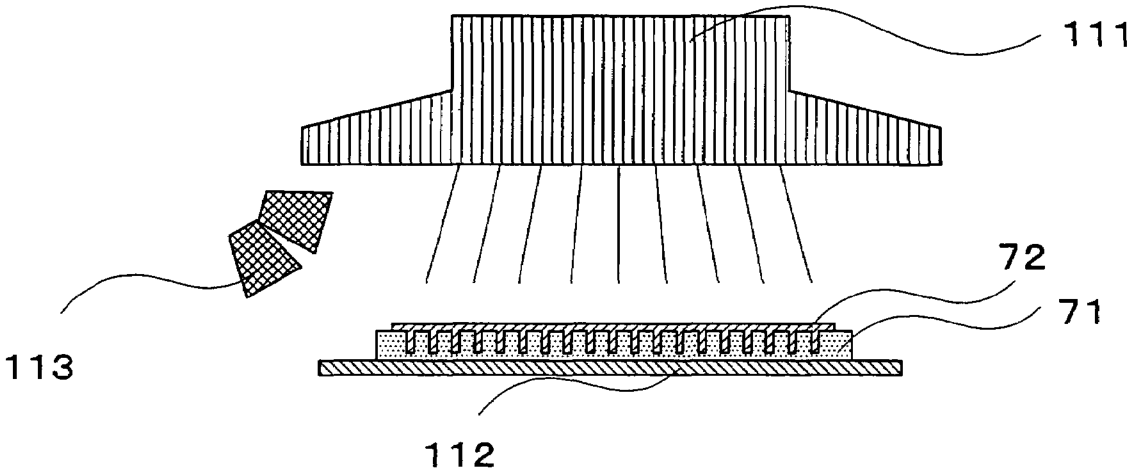
FIG. 11 is a side view depicting a state where a curing-inhibited portion is formed while a transfer material is being cured by UV rays.

FIG. 11 shows the principle and the first example of the present invention. For the transfer material, a paste, formed by mixing a low melting point glass powder and a transfer material comprised of a photopolymerizable prepolymer or monomer and a photopolymerization reaction initiator, is used. In this transfer material, radicals generated by UV irradiation polymerizes the prepolymer or monomer. The radicals are chemically very active, so if oxygen or ozone exists in the atmosphere, the radicals react with the oxygen or ozone, and radicals that contribute to polymerization decrease, and as a result, the prepolymer or monomer cannot be polymerized, forming an uncured state (curing-inhibited state).

Figure 13:
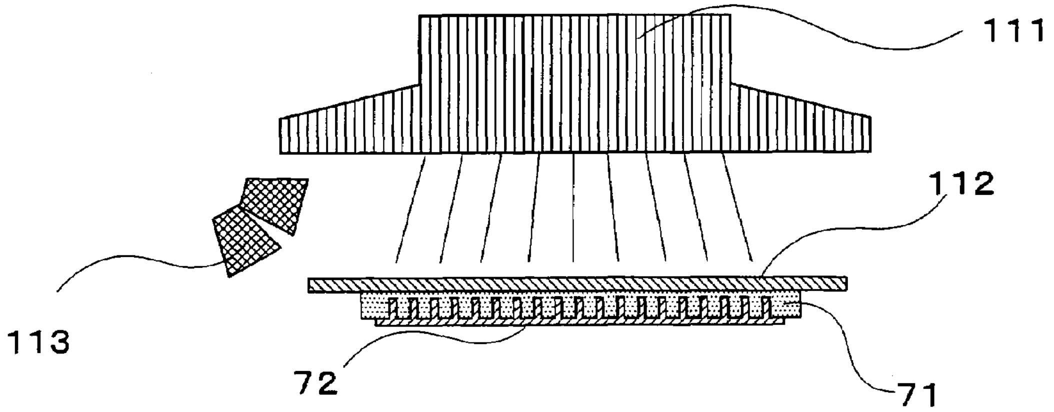
FIG. 13 is another side view depicting a state where a curing-inhibited portion is formed while a transfer material is being cured by the UV rays.

In this example, the curing-inhibited portion is intentionally created on the surface of the transfer material by irradiating UV rays onto the transfer material in an atmosphere that contains at least one of oxygen and ozone after filling the transfer material into the intaglio plate for transfer. FIG. 11 schematically shows a status where the transfer material 72 filled into the grooves of an intaglio plate for transfer 71 placed on a base 112, is cured by irradiating UV rays from a UV irradiation device 111 in an atmosphere that contains at least one of oxygen and ozone, and the curing-inhibited portion is intentionally created on the surface during the curing. Curing inhibition can be promoted by setting an ozonizer 113 in the atmosphere and changing the atmosphere of the UV irradiation to one containing ozone. An ozone-containing atmosphere becomes more effective by using a fan. The UV irradiation direction can be any direction. If the intaglio plate for transfer transmits UV rays, the UV rays may be irradiated behind the intaglio plate for transfer through the intaglio plate for transfer, as shown in FIG. 13. UV rays for certain may be irradiated from the bottom side in FIG. 13.

Figure 12:
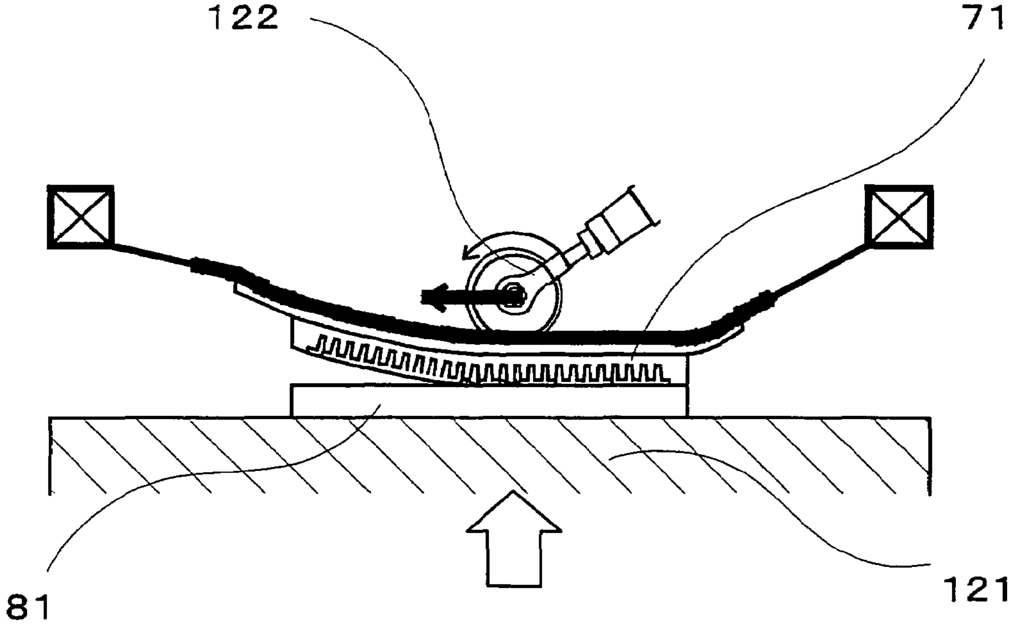
FIG. 12 is a side view depicting a state where a transfer material is transferred from an intaglio plate for transfer to a substrate.

In this way, the curing-inhibited portion is generated in the transfer material of the intaglio plate for transfer, and the side of the curing-inhibited portion of this intaglio plate for transfer is made to face a substrate so as to transfer the transfer material to the substrate. FIG. 12 schematically shows a status where the intaglio plate for transfer 71 is set to face the substrate 81 placed on a base 121, and is pressed by a roller 122, which is on the rear side of the intaglio plate for transfer 71, so that the curing-inhibited portion of the transfer material adheres to the substrate 81, and the transfer material is transferred from the intaglio plate for transfer 71 to the substrate 81.

Since the surface of the transfer material is sticky due to the curing inhibition, the surface itself has adhesiveness, which makes the transfer by adhesion possible by contacting. To increase this adhesion strength, it is effective to add an adhesive resin of which the glass transition point is low, (about −150 to about 60° C.), as the adhesive substance.

Example 2

This is an example when the UV rays are also irradiated from the rear face of the substrate through the substrate at the transfer in Example 1, so as to promote curing. For this purpose, it is necessary that the substrate transmits UV rays. The device in FIG. 12 may be used for this purpose. In other words, as the arrow mark in FIG. 12 shows, UV rays are irradiated from the rear face of the substrate through the substrate to promote curing. In this case, the base contacting the rear face of the substrate must also transmit UV rays. If the intaglio plate for transfer transmits UV rays, the UV rays may be irradiated from the back of the intaglio plate for transfer through the intaglio plate for transfer, instead of the above.

Example 3

Figure 14A:
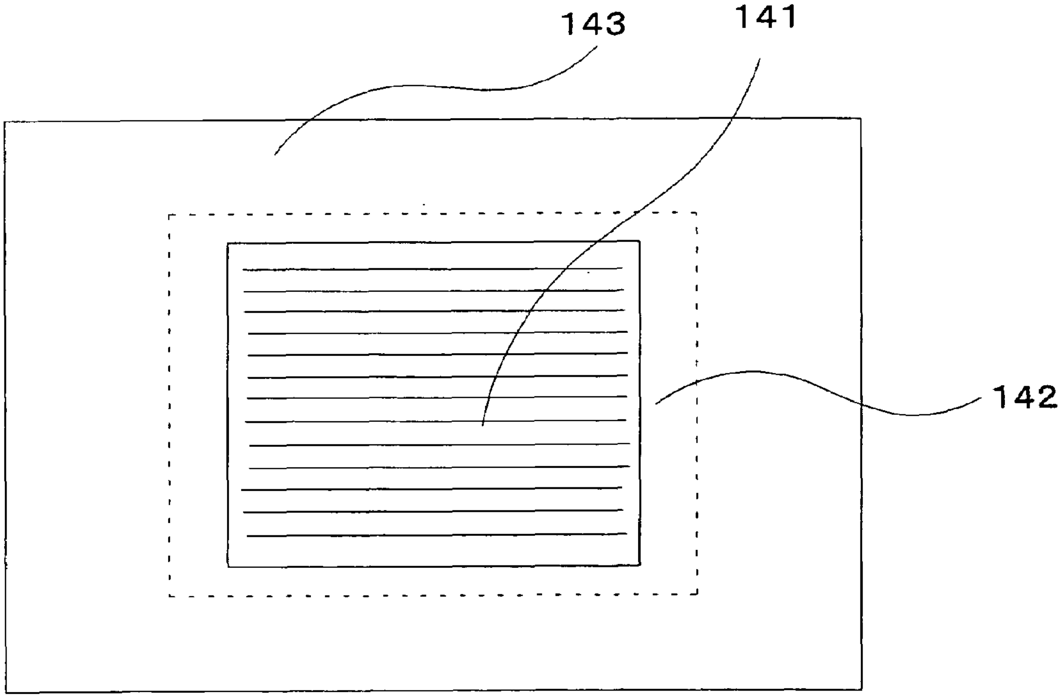
FIG. 14A is a schematic plan view depicting an intaglio plate for transfer for irradiating UV rays from the rear face thereof.
Figure 14B:
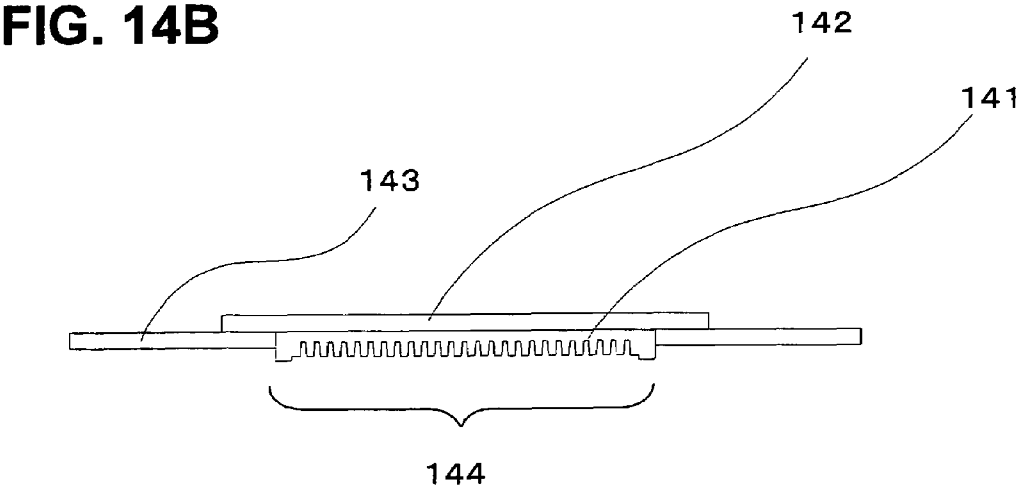
FIG. 14B is a schematic side cross-sectional view depicting the intaglio plate for transfer for irradiating UV rays from the rear face thereof.

This example specifically explains the method for irradiating the UV rays from the rear face of the intaglio plate for transfer. FIG. 14A and FIG. 14B are a schematic plan view and schematic side cross-sectional view of this example. In FIG. 14A and FIG. 14B, a transfer area (groove formation area) 141 of an intaglio plate for transfer is created by a transparent silicone rubber, and a PET (polyethylene terephthalate) film 142 (indicated by the dotted line in FIG. 14A) is layered for suppressing the stretch in the plane direction and compensating for the dimensional accuracy, so as to form an intaglio plate for transfer. Also when this intaglio plate for transfer is set on a device for transfer, a stainless steel sheet 143 is partially superimposed on the PET film 142, surrounding the transfer area 141 of the intaglio plate for transfer, for reinforcement, so that the planar dimensions are not changed by such external forces as gravity and tension. This stainless steel sheet forms a frame surrounding the intaglio plate for transfer 141, where a hole 144 is opened in the transfer area, so UV rays can be irradiated from the rear side of the intaglio plate for transfer. Needless to say, in the present configuration, UV rays may also be irradiated from the side where the transfer material is filled.

Figure 15:
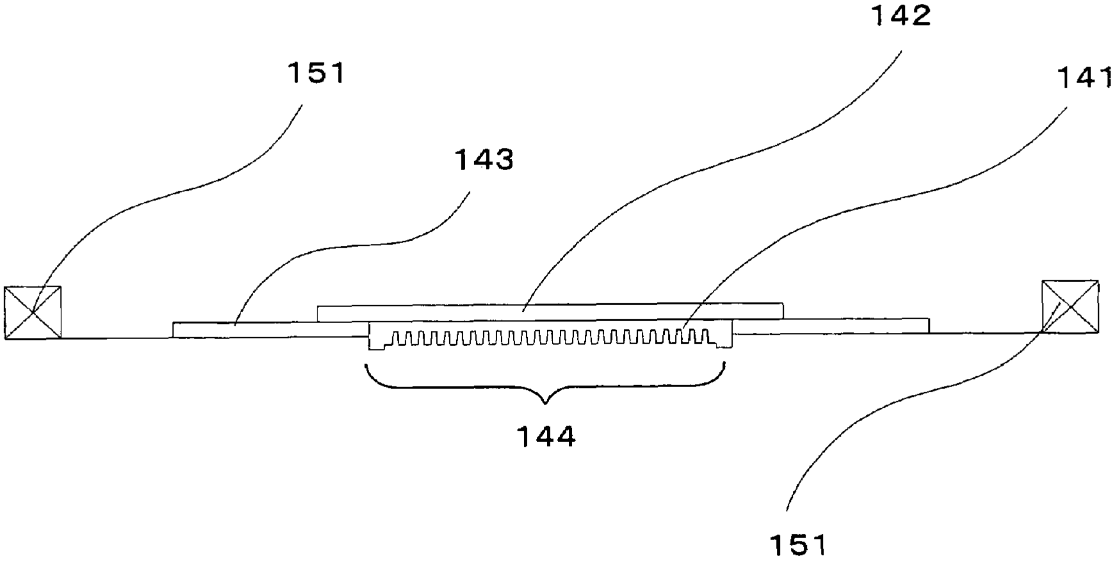
FIG. 15 is a schematic view depicting a state where tension is applied to the intaglio plate for transfer in FIG. 14.

If this intaglio plate for transfer configured in this way is spread with tension on frames 151 at both sides that are for applying tension, as shown in FIG. 15, then a plane intaglio plate for transfer can be implemented without distorting the transfer area. By appropriately selecting the level of tension at this time, pressing by a roller as shown in FIG. 12 becomes possible, so that the transfer material can be transferred with maintaining a desired shape, and UV rays can be irradiated through the intaglio plate for transfer. For the materials to be used, any material is acceptable as long as it is not counter to the purpose of the present invention, and is not limited to the above mentioned silicone rubber, PET film and stainless steel. For the frame, any metal may be used instead of stainless steel.

Figure 16:
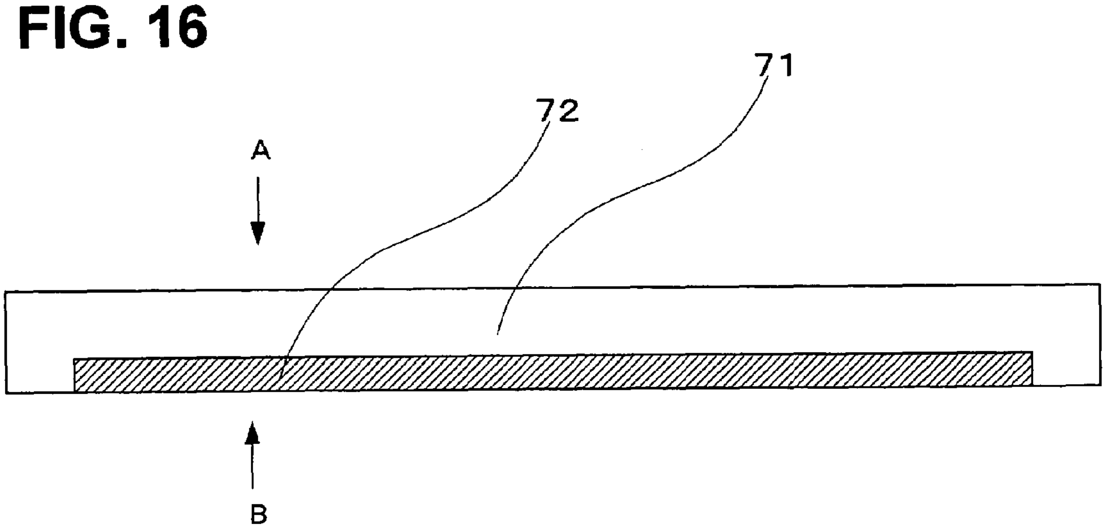
FIG. 16 is a schematic side cross-sectional view depicting a state where a transfer material is filled only into the grooves of an intaglio plate for transfer.
Figure 17:
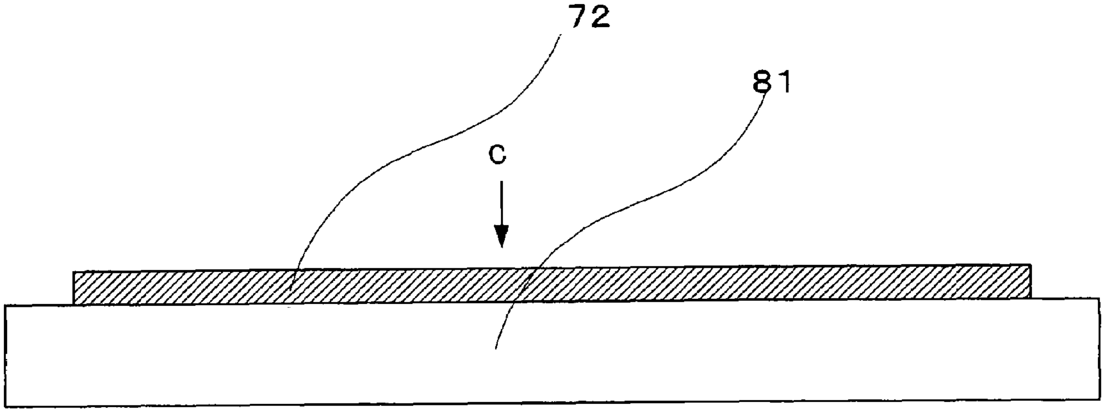
FIG. 17 is a schematic side cross-sectional view depicting a state where a transfer material is transferred onto a substrate.
Figure 18:
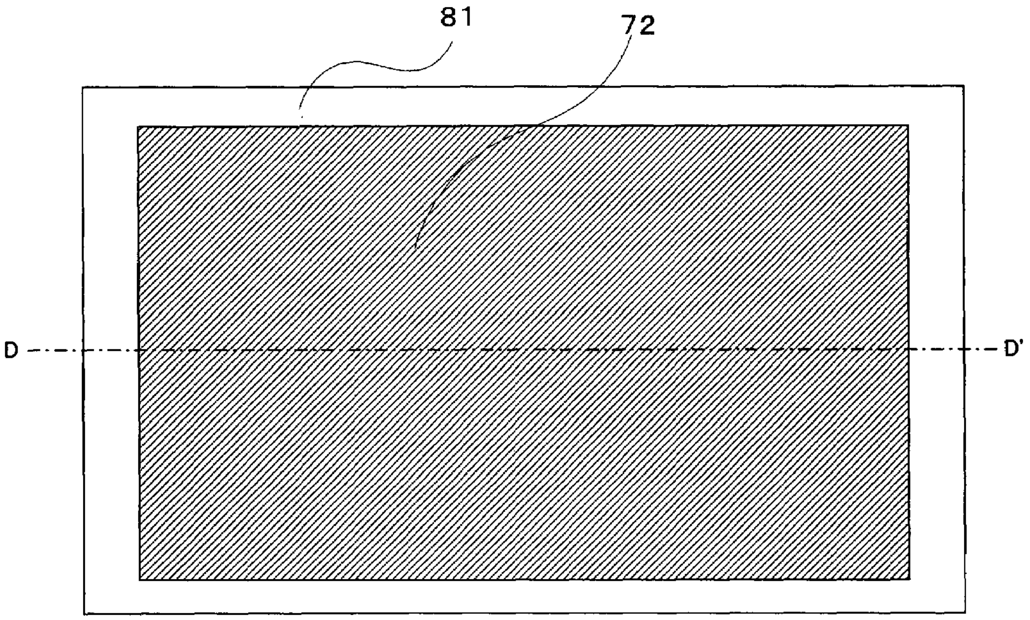
FIG. 18 is a top view of a substrate depicting a state where a transfer material is transferred onto the substrate.

Example 1 to Example 3 are examples of forming the partitions (protrusions) by transferring a transfer material to the substrate for a PDP, but needless to say, the present invention can be used regardless the shape of the concave portions of the intaglio plate for transfer when viewed from the top or bottom of the intaglio plate. For example, FIG. 16 is a diagram depicting a status where a transfer material is filled in an intaglio plate for transfer, but the concave portion is not shaped for a plurality of protrusions, but is a wide square when viewed from the top of the intaglio plate (direction A in FIG. 16) or the bottom of the intaglio plate (direction B in FIG. 16). FIG. 17 and FIG. 18 are diagrams depicting the status where the transfer material in FIG. 16 is transferred to the substrate. FIG. 18 is a view of FIG. 17 seen from the direction C in FIG. 17, that is, FIG. 17 is the D–D' cross-sectional view of the diagram in FIG. 18. The shape of the concave portions viewed from the top of the intaglio plate is not limited to a square, but may be a triangle or circle, and it is clear that the present invention does not depend on the shape of the concave portions viewed from the top of the intaglio plate. The depth of the concave portions may be partially different. For the cross-sectional shape of the concave portions, needless to say, a square, trapezoid, triangle or semi-circle are preferable for transfer.

What is claimed is:

1. A material transfer method for transferring a transfer material filled in concave portions of an intaglio plate for transfer onto a substrate, comprising:

preparing an UV-curable transfer material that is not cured in an atmosphere that contains at least one of oxygen and ozone, even if UV rays are irradiated, and that indicates adhesion in an uncured state;

filling said transfer material into the concave portions of said intaglio plate for transfer, and irradiating the UV rays onto said transfer material in said atmosphere that contains one of oxygen and ozone to cure portions other than the portion exposed from said intaglio plate to the atmosphere; and adhering the uncured area of said transfer material to said substrate and transferring said transfer material to said substrate.

2. The material transfer method according to claim 1, wherein at least one of said substrate and said intaglio plate for transfer transmits UV rays, the method further comprising curing said uncured area by irradiating UV rays onto said substrate or intaglio plate for transfer in a status where the uncured area of said transfer material adheres to said substrate.

3. The material transfer method according to claim 1, wherein said transfer material contains a low melting point glass material, photopolymerizable compound and photopolymerization reaction initiator.

4. The material transfer method according to claim 3, wherein the photopolymerization reaction initiator contained in the transfer material is a radical polymerization initiator.

5. A manufacturing method for a substrate for a plasma display panel, comprising the transfer method according to one of claims 1 to 4, wherein said transfer material is formed on the substrate as ribs to partition a discharge space.

* * * * *